(12) United States Patent
Intrater et al.

(10) Patent No.: US 10,290,334 B2
(45) Date of Patent: May 14, 2019

(54) READ LATENCY REDUCTION IN A MEMORY DEVICE

(71) Applicant: Adesto Technologies Corporation, Santa Clara, CA (US)

(72) Inventors: Gideon Intrater, Sunnyvale, CA (US); Bard Pedersen, Fremont, CA (US); Ishai Naveh, San Jose, CA (US)

(73) Assignee: Adesto Technologies Corporation, Santa Clara, CA (US)

(*) Notice: Subject to any disclaimer, the term of this patent is extended or adjusted under 35 U.S.C. 154(b) by 0 days.

(21) Appl. No.: 15/720,244

(22) Filed: Sep. 29, 2017

(65) Prior Publication Data

US 2018/0025761 A1 Jan. 25, 2018

Related U.S. Application Data

(63) Continuation of application No. 15/061,732, filed on Mar. 4, 2016, now Pat. No. 9,812,183.

(51) Int. Cl.

| | | |
|---|---|---|
| *G11C 8/06* | (2006.01) | |
| *G11C 7/06* | (2006.01) | |
| *G11C 7/10* | (2006.01) | |
| *G11C 7/22* | (2006.01) | |
| *G11C 5/06* | (2006.01) | |
| *G11C 29/02* | (2006.01) | |
| *G11C 29/04* | (2006.01) | |
| *G11C 29/50* | (2006.01) | |

(52) U.S. Cl.
CPC ............. *G11C 8/06* (2013.01); *G11C 5/066* (2013.01); *G11C 7/062* (2013.01); *G11C 7/103* (2013.01); *G11C 7/106* (2013.01); *G11C 7/1057* (2013.01); *G11C 7/22* (2013.01); *G11C 29/021* (2013.01); *G11C 29/028* (2013.01); *G11C 2029/0409* (2013.01); *G11C 2029/5006* (2013.01)

(58) Field of Classification Search
CPC .... G11C 2029/0409; G11C 2029/5006; G11C 29/021; G11C 29/028; G11C 5/066; G11C 7/062; G11C 7/103; G11C 7/1057; G11C 7/106; G11C 7/22; G11C 8/06
See application file for complete search history.

(56) References Cited

U.S. PATENT DOCUMENTS

| | | |
|---|---|---|
| 6,321,315 B1 | 11/2001 | LaBerge |
| 7,562,180 B2 | 7/2009 | Gyl et al. |
| 7,593,263 B2 | 9/2009 | Sokolov et al. |

(Continued)

*Primary Examiner* — James G Norman
(74) *Attorney, Agent, or Firm* — Michael C. Stephens, Jr.

(57) ABSTRACT

A memory device can include: a memory array with memory cells arranged as data lines; an interface that receives a read command requesting bytes of data in a consecutively addressed order from an address of a starting byte; a first buffer that stores a first data line from the memory array that includes the starting byte; a second buffer that stores a second data line from the memory array, which is consecutively addressed with respect to the first data line; output circuitry configured to access data from the buffers, and to sequentially output each byte from the starting byte through a highest addressed byte of the first data line, and each byte from a lowest addressed byte of the second data line until the requested data bytes has been output; and a data strobe driver that clocks each byte of data output by a data strobe on the interface.

20 Claims, 13 Drawing Sheets

(56) References Cited

U.S. PATENT DOCUMENTS

| | | |
|---|---|---|
| 8,806,071 B2 | 8/2014 | Zitlaw |
| 8,966,151 B2 | 2/2015 | Zitlaw |
| 9,454,421 B2 | 9/2016 | McClain et al. |
| 2010/0124102 A1* | 5/2010 | Lee .................. G11C 7/1018 365/163 |
| 2015/0143020 A1 | 5/2015 | Ferreira et al. |

* cited by examiner

READ LATENCY REDUCTION IN A MEMORY DEVICE

RELATED APPLICATIONS

This application is a continuation of the following application, U.S. patent application Ser. No. 15/061,732, filed on Mar. 4, 2016, and which is hereby incorporated by reference as if set forth in full in this specification.

FIELD OF THE INVENTION

The present invention generally relates to the field of semiconductor devices. More specifically, embodiments of the present invention pertain to memory devices, including both volatile and non-volatile memory devices, such as flash memory devices, resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Microprocessor performance can be very sensitive to memory latency. Many non-volatile memory devices have an access time or latency that is relatively slow as compared to the microprocessor. In addition, many implementations of various communication protocols between a microprocessor/host and memory, such as serial peripheral interface (SPI) can add even more latency than is required by the memory array itself.

DETAILED DESCRIPTION OF EMBODIMENTS

Figure 1:
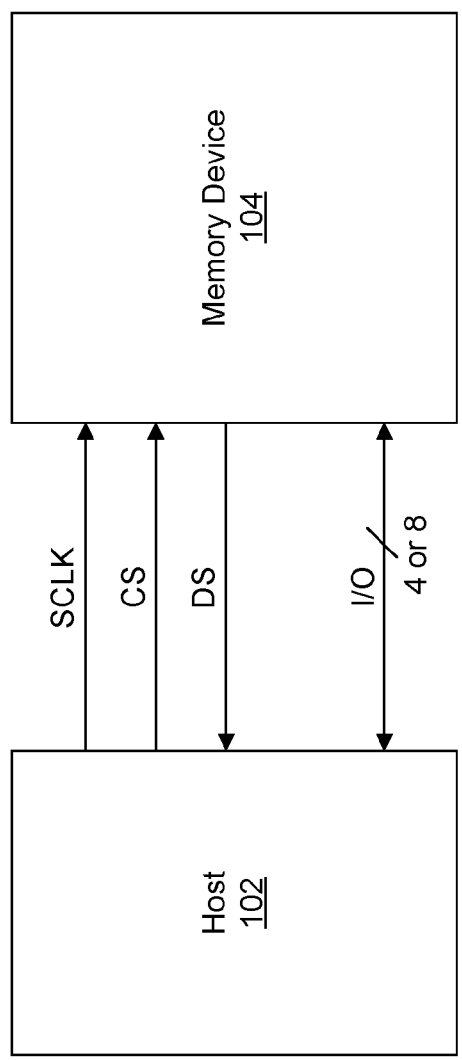
FIG. 1 is an example memory device and host arrangement, in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including volatile memory, such as SRAM and DRAM, and including non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one particular example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, and in particular NVM devices, such as flash memory devices, and may include resistive switching memory devices in some cases.

Referring now to FIG. 1, shown is an example memory device and host arrangement 100, in accordance with embodiments of the present invention. In this example, host 102 can interface with memory device 104 via a serial interface. For example, host 102 can be any suitable controller (e.g., CPU, MCU, general-purpose processor, GPU, DSP, etc.), and memory device 104 can be any type of memory device (e.g., SRAM, DRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI), can be included for communication between host 102 and memory device 104. For example, serial clock (SCK) can provide a clock to device 104, and may be used to control the flow of data to the device. Command, address, and input data (e.g., via I/O pins) can be latched by memory device 104 on a rising edge of SCK, while output data (e.g., via I/O pins) can be clocked out of memory device 104 by SCK or data strobe (DS). Chip select (CS), which may be active low, can be utilized to select memory device 104, such as from among a plurality of such memory devices sharing a common bus or circuit board, or otherwise as a way to access the device. When the chip select signal is de-asserted (e.g., at a high level), memory device 104 can be deselected, and placed in a standby mode. Activating the chip select signal (e.g., via a high to low transition on CS) may be utilized to start an operation, and returning the chip select signal to a high state can be utilized for terminating an operation. For internally self-timed operations (e.g., a program or erase cycle), memory device 104 may not enter standby mode until completion of the particular ongoing operation if chip select is de-asserted during the operation.

In the example interface, data can be provided to (e.g., for write operations, other commands, etc.) and from (e.g., for read operations, verify operations, etc.) memory device 104 via the I/O signals. For example, input data on the I/O can be latched by memory device 104 on edges of SCK, and such input data can be ignored if the device is deselected (e.g., when the chip select signal is de-asserted). Data can be output from memory device 104 via the I/O signals as well. For example, data output from memory device 104 can be clocked out on edges of DS or SCK for timing consistency, and the output signal can be in a high impedance state when the device is deselected (e.g., when the chip select signal is de-asserted).

In one embodiment, a memory device can include: (i) a memory array having a plurality of memory cells arranged as a plurality of data lines, where each data line includes a predetermined number of bytes of data; (ii) an interface configured to receive a read command from a host that requests a plurality of bytes of data in a consecutively addressed order from an address of a starting byte; (iii) a first buffer configured to store a first of the plurality of data lines from the memory array, where the first data line includes the starting byte; (iv) a second buffer configured to store a second of the plurality of data lines from the memory array, where the second data line is consecutively addressed with respect to the first data line; (v) output circuitry configured to access data from the first buffer, and to sequentially output each byte from the starting byte through a highest addressed byte of the first data line; (vi) the output circuitry being configured to access data from the second buffer, and to sequentially output each byte from a lowest addressed byte of the second data line until the requested plurality of bytes of data has been output in order to execute the read command; and (vii) a data strobe driver configured to clock each byte of data output from the memory device by a data strobe on the interface, where the data strobe is activated at a reduced read latency when the starting address is aligned with a lowest addressed byte of the first data line.

Figure 2:
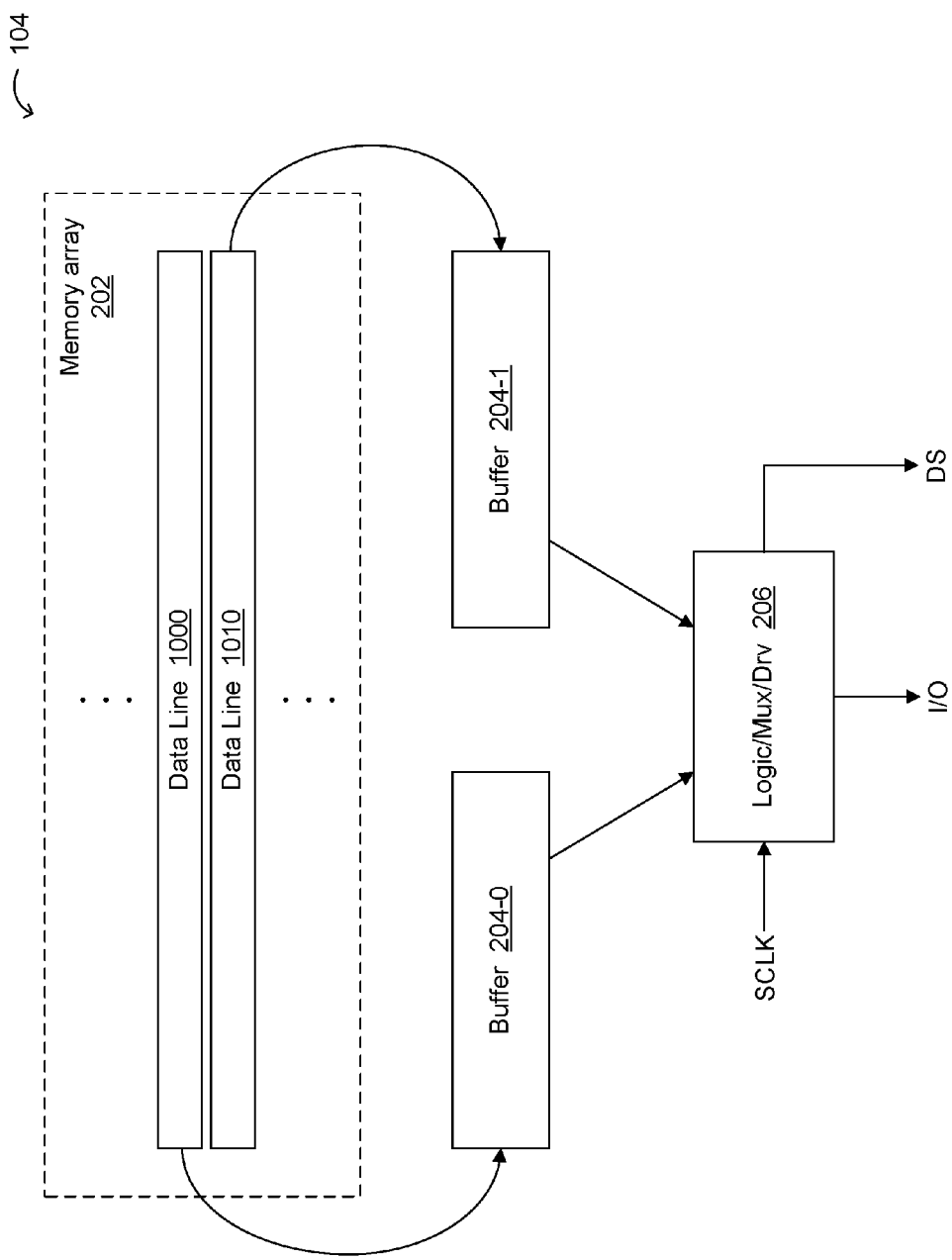
FIG. 2 is a block diagram of an example memory array and buffer arrangement for reading data, in accordance with embodiments of the present invention.

Referring now to FIG. 2, shown is a block diagram of an example memory array and buffer arrangement for reading data, in accordance with embodiments of the present invention. For example, memory device 104 can include memory array 202 (e.g., a flash memory array), and buffers 204-0 and 204-1, which can be implemented in SRAM or any other relatively fast access memory. In some arrangements, only one or more than two buffers 204 can be provided, such as multiple buffers for multi-layer buffering and deeper pipelining. Memory device 104 can be configured as a data flash and/or a serial flash device, and memory array 202 can be organized as any suitable number or arrangement of pages of data. Output circuitry 206 can receive a clock signal, and may perform various logic, multiplexing, as well as driving functions in order to drive I/O pins (e.g., 4, 8 or any other number of pins) and the optional data strobe pin (DS).

As used herein, a "data line" can be a group of bytes of data, which may include code for in-place execution and/or data otherwise used in code execution, or any other type of stored data. A data line can be a group of consecutively addressed bytes of data that can be accessed from a memory array in one memory access cycle, and which may be output from the memory device over a plurality of output cycles (e.g., 16 cycles, or 8 cycles of double data rate output) of a clock or data strobe. For example, memory cells in a data line may share a common word line and selected bank of sense amplifiers. As one particular example, a data line may be equivalent to a cache line that may be requested to be filled by the host, or a page of data. Also for example, a data line can be 16 bytes of data that are sequentially/consecutively addressed. Further, a data line may represent a boundary such that when one byte within a given data line is requested as part of a read operation, a subsequent memory array access to a next sequentially addressed data line may be utilized in order to bring out a full data line worth (e.g., 16 sequential bytes) of data, starting with the requested byte. Also, in some cases, a data line can also include extra bits, in addition to byte quantities of data.

Thus in many cases, two reads to memory array 202 can occur prior to (e.g., in a pre-fetch), or in parallel with, outputting the data via output circuitry 206. For example, data line 1000 (e.g., 16 bytes=128 b) can be accessed from memory array 202, provided to buffer 204-0, and output via output circuitry 206. Then, data line 1010 can be accessed, and provided to buffer 204-1 for outputting via output circuitry 206. As labeled herein, the data lines are identified by way of their example starting byte aligned address in hexadecimal. Thus, "1000" may be the hexadecimal address of the lowest addressed byte of the corresponding data line (i.e., the byte corresponding to the lowest address of the given data line), and "1010" may be the hexadecimal address of the lowest addressed byte of the next sequentially addressed data line, for a 16 byte data line size.

Buffering (e.g., via buffers 204) can be utilized to deal with memory array access latency, and may allow for chunks of 128 b (e.g., a data line size) to be output from the memory device every 8 clock cycles. For example, each of buffers 204-0 and 204-1 can store at least 128 b of data. In standard SPI, there may be no way to notify host 102 that buffers 204 may have insufficient data (e.g., less than 128 b of data) that satisfy the present read request (e.g., from the starting address to consecutively addressed bytes for a total of 16 bytes), and increased latency may occur as a result. Thus, 2 entities or data lines can be accessed ahead of time (pre-fetched) in a sequential and ping-ponged fashion, such as data line 1000 being provided to buffer 204-0, followed by data line 1010 being provided to buffer 204-1. This can ensure sufficient buffering in order to meet output clocking requirements for the memory device. In this way, read requests can be issued by host 102, e.g., every 4 or 8 clock (e.g., SCK) cycles, and the streaming out of data (e.g., once buffers 204 sufficiently full) can effectively be sequential with pre-fetching, such as to a 128 b chunk of data every 4 or 8 cycles, depending on the I/O and data line width/size configurations.

In an example operation, if a read request with a particular starting address byte of a 128 b entity (e.g., a data line) is received by the memory device, such data can be output from the memory device, and a request can be sent from the host or implied in order to read out the next sequentially/consecutively addressed data line. If the read request includes a starting address toward end of a given data line, there may be insufficient data that can be sequentially (e.g., consecutively addressed bytes) accessed from that data line, as will be discussed in more detail below. For example, one such case in which only a single entity or data line need be accessed to satisfy a read request is where the first byte (i.e., the data byte at the lowest address) in a given data line is the starting address. This particular case may have a probability of 1/16 of occurring for a 16 byte data line size.

However, a read latency bottleneck can occur due to this process of utilizing back-to-back reads from memory array 202. This bottleneck can be due to a requirement that the starting byte address could be any byte (byte-aligned addressing). In order to accommodate all addressing cases, including the extreme case whereby the last byte (i.e., the data byte at the highest address) of the N-bits (e.g., a data line) sensed is requested as the starting byte, and then the first byte of the next N-bits (e.g., the next consecutively addressed data line) may be accessed, two memory array accesses must occur for each read request. In another approach, one or more mode bits can be utilized in order to change to word, double-word, or even line-aligned addressing, which could be used in order to increase the time between the back-to-back reads, and to accordingly reduce the apparent latency of the read operation.

Figure 3:
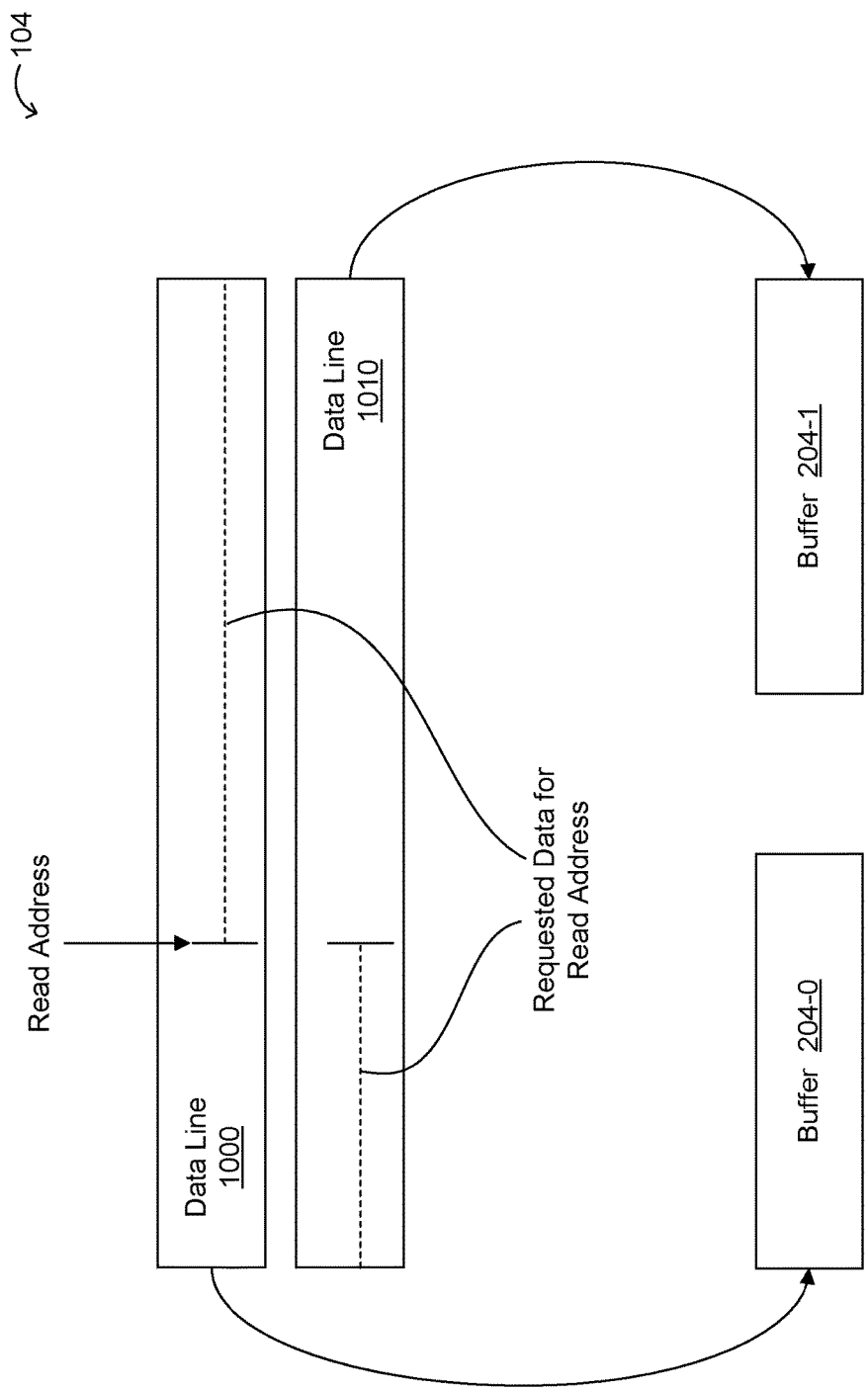
FIG. 3 is a block diagram of an example data line and buffer arrangement, in accordance with embodiments of the present invention.

Referring now to FIG. 3, shown is a block diagram of an example data line and buffer arrangement, in accordance with embodiments of the present invention. This particular example shows how some memory (e.g., NVM) devices have a relatively high read latency due to performing two read accesses before returning (e.g., via output circuitry 206) the first data item to the host. For a read operation, such as with a starting byte address as shown within data line 1000, the requested data, which may be an amount equal to that which is stored in a data line (e.g., 16 bytes), may include data bytes from a beginning portion or lower addressed byte portion of the next sequential (e.g., consecutively addressed) data line 1010. Thus, two rows or data lines may be accessed, which can effectively double the basic time to read, as compared to a single data line access. As shown, this approach accommodates starting byte address occurring anywhere within a data line, and whereby sequentially addressed bytes of data can overlap the data line boundary, in order to keep up with I/O speed.

Figure 4A:
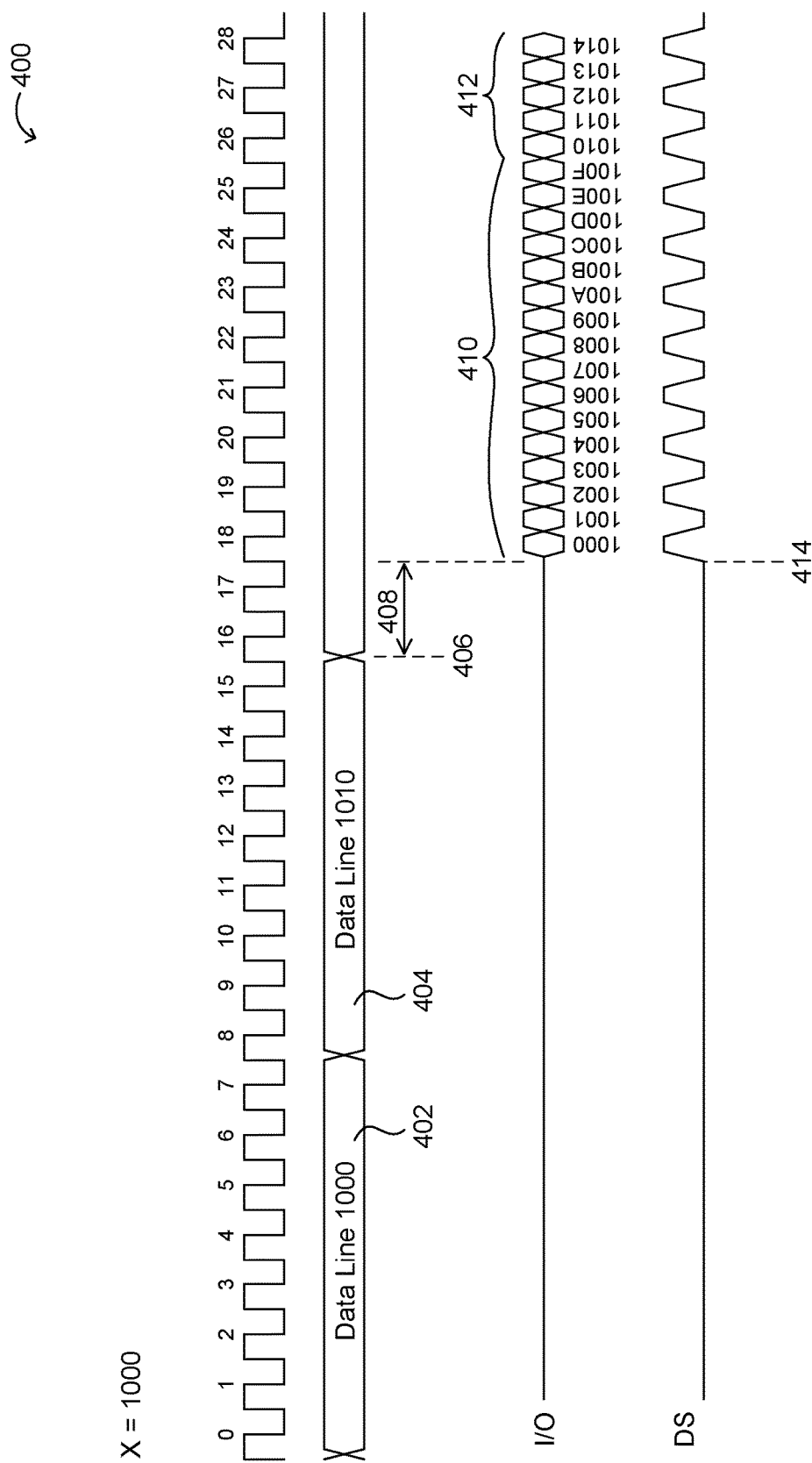
FIGS. 4A and 4B are timing diagrams of example read accesses, in accordance with embodiments of the present invention.
Figure 4B:
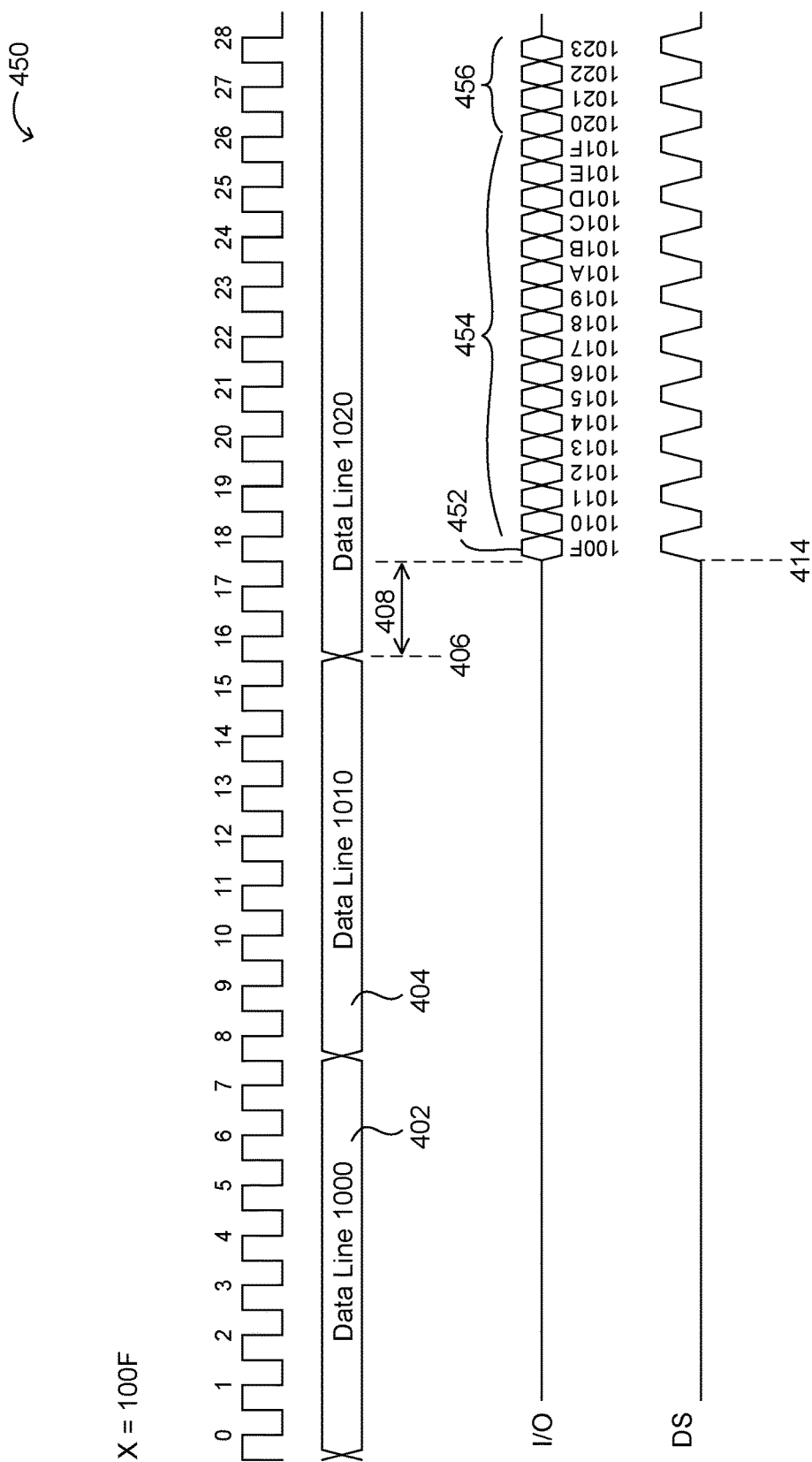

Referring now to FIGS. 4A and 4B, shown are timing diagrams of example read accesses, in accordance with embodiments of the present invention. In example 400, a starting address "X" can be equal to 1000, and thus may be the first byte (e.g., lowest addressed byte) of data line 1000. Accesses from memory array 202 are shown as access 402 of data line 1000, which can be provided to buffer 204-0, followed by access 404 of data line 1010, which can be provided to buffer 204-1. Thus, buffers 204 can be filled by 406, and a delay 408 can represent access time from buffers 204 through the output via output circuitry 206. For example, data 410 that is output over 8 clock cycles at a double data rate can represent the full data of data line 1000, and data 412 may represent sequentially/consecutively addressed and lower significant byte portions of data line 1010, in order to fill the read request. Thus in this example, 8 I/O lines may output a full data line of 16 bytes of data, and may be strobed out via DS beginning at 414.

While the above example shows a starting byte address of the lowest addressed byte of the data line (e.g., 1000), example 450 shows a starting byte address that is the last byte (e.g., highest addressed byte) of the given data line. In this example, data 452 may represent data corresponding to the starting address (e.g., X=100F) contained within data line 1000. Also, data 454 may represent data from the next sequentially/consecutively addressed data line 1010, and data 456 may represent data from a subsequent/sequentially addressed data line 1020. It should be noted that the data strobe for clocking out the data is activated at 414. Thus in these examples, the same read latency occurs for a variety of starting addresses of the given data line, including the lowest byte address (X=1000) of FIG. 4A, as well as the highest byte address (X=100F) of FIG. 4B.

Figure 5:
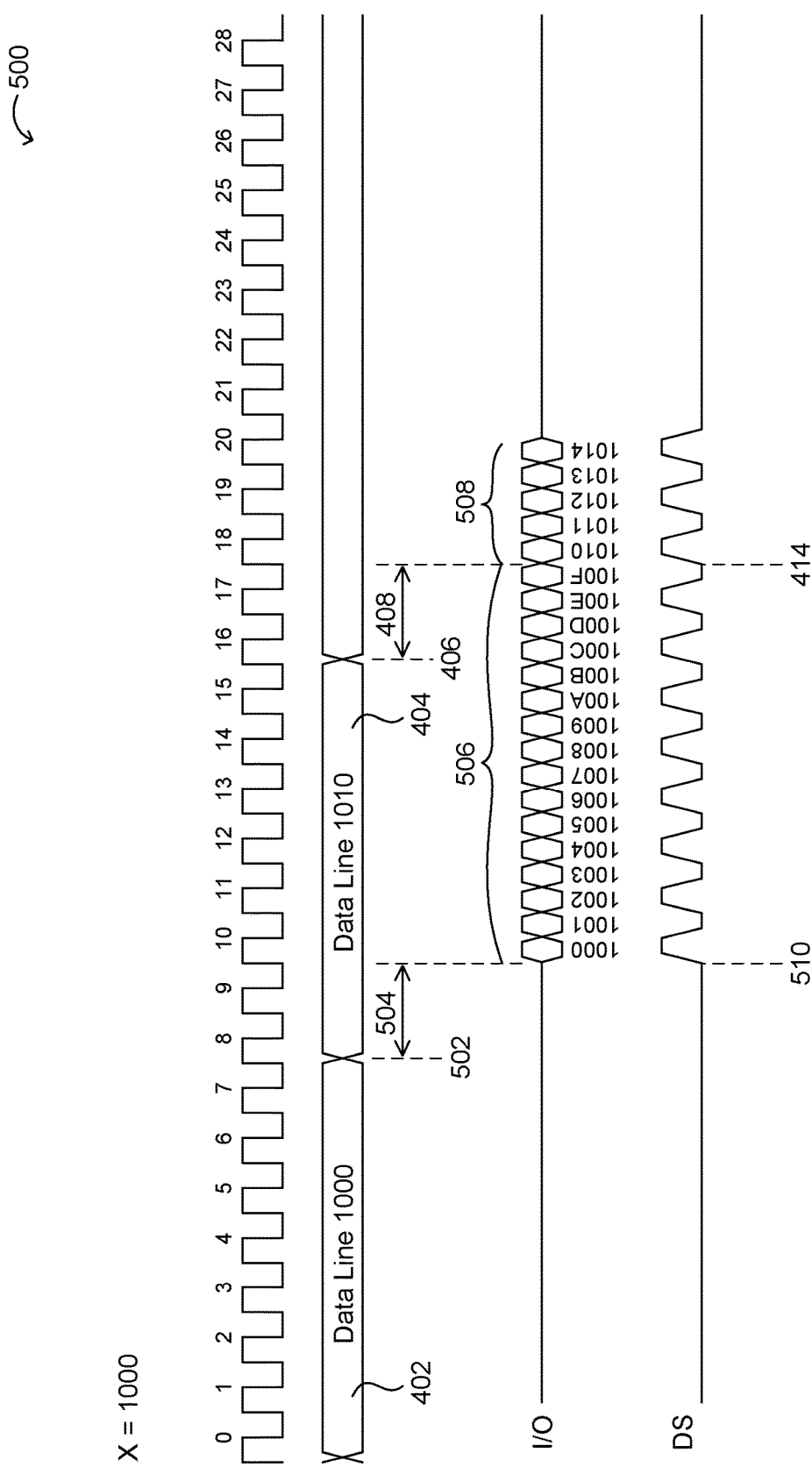
FIG. 5 is a timing diagram of an example read access with reduced latency and data strobe timing, in accordance with embodiments of the present invention.

Referring now to FIG. 5, shown is a timing diagram 500 of an example read access with reduced latency and data strobe timing, in accordance with embodiments of the present invention. In particular embodiments, when the read request is fully aligned (e.g., the starting byte address aligned with the data line address), either a single memory array read access can be performed, and/or read latency can be reduced by not waiting for a subsequent read access (e.g., 404). Thus, for a starting address of a byte that is aligned with a given data line, there may be no need to do two full reads from the memory array before starting to send data on the I/O lines. As such, the requested data may be fully supplied, e.g., by access 402 of data line 1000, which can be complete by 502. After a delay 504 for propagation through output circuitry 206, data can be available at 510. Alternatively, delay 504 may be less than the 2 cycles shown, or otherwise may be overlapped or pipelined with other data output processing such that the data is available at 502 instead of 510. In any case, the read latency can be reduced with respect to the double access approach discussed above, in which the DS activation timing is shown at 414.

In certain embodiments, host 102 may be aware that the data (e.g., 506 representing data line 1000) may be available earlier because the host sent an aligned address, and/or DS can be utilized to convey to the host that the data is ready at 510. Even though the data from next sequential data line 1010 may not be needed by the host in this particular example, at least a portion of this data can still be output at 508. In any event, DS can be relied on not just for clocking the data, but also for determining that the data from the memory device is ready. Thus, the host can also utilize DS as a flow-control signal to control pulling the data out by determining a data ready state, as part of its state machine functionality. For example, a state machine in the host may count dummy cycles, etc., so as to determine whether data is available for read out from the buffer, and to begin collecting the data from the memory device when available. Accordingly, in certain embodiments, DS can be used to clock data out, as well as to provide a data ready indicator to the host.

This approach can improve read latency for the cases (e.g., 1 out of 16) when the starting or read request address is byte-aligned with the beginning of the corresponding data line, and can be indicated by moving DS up (e.g., from 414 to 510) as shown for such cases. If the request address (i.e., starting byte address) is naturally aligned to "data lines" that may be defined by the number of sense amplifiers (e.g., 16-bye aligned in a device with 128 shared sense amps), there may be a single memory array access before returning data to the host. In other (non-aligned) request cases, two memory array accesses may still be utilized, as discussed above. In any event, the DS can convey data availability timing to the host by being activated (e.g., toggling).

Control of the DS pin can also be utilized in support of informing the host that the memory may need to pause the transmission of data over the I/O lines. This may be needed when the memory might require extra latency due to "housekeeping" functions or any other reason. In certain embodiments, DS can be utilized as a "back-pressure mechanism" or "flow-control mechanism" to inform the host when more time is needed, such as may be accommodated by dummy cycles or other predefined wait states. For example, DS may stop toggling when waiting for data to be fetched from the memory array, may be driven to a constant value upon completion of the address phase, and can begin toggling when the first data is ready to be output from the memory device.

In any event, the host can utilize DS (or SCK) toggling in order to clock the data in to receive in the host device. Further, in cases whereby the burst of data may not be maintained after the first batch of data (e.g., due to wrap-around fetching), the DS can be frozen until the memory device "recovers" from the wrap-around operation, and can then again stream data. In wrap-around fetching, the "consecutively addressed" bytes of data can wrap-around from a highest addressed byte to a lowest addressed byte within a given data line. It should be noted that on a memory device whereby the number of sense amplifiers activated for a given memory array access matches the bus throughput, this "freeze" may happen only once (e.g., after sending the first batch of data), and the probability of such a freeze is relatively low in sequential read cases. However, this probability may be somewhat higher in reads that support wrap-around functionality, and depending on the cache line size. Further, if a DRAM is used in the memory implementation, the pause may be required for handling refresh operations, as just one example.

Also in particular embodiments, variable DS functionality/timing can allow for the memory device to re-read data in case of read errors, which can potentially increase the maximum operating frequency. This is as opposed to operating, e.g., a flash memory device at a frequency level that essentially guarantees no such data errors. Instead, the frequency can be allowed to go higher so long as the gains from such a frequency increase are higher than time that may be lost in processing any re-reads. In order to detect and correct read errors, or other errors, such as due to defective cells or radiation effects, re-read functionality and error-correcting code (ECC) can be employed. An alternative to increasing read speed is to decrease read current, such as for devices that are not running at maximum speed. For example, this can be done by using a lower read current, or by using shorter read pulses at a lower clock speed (e.g., frequency). In this case, the variable DS can be utilized to reduce overall power consumption for reads at such relatively low speeds.

Figure 6:
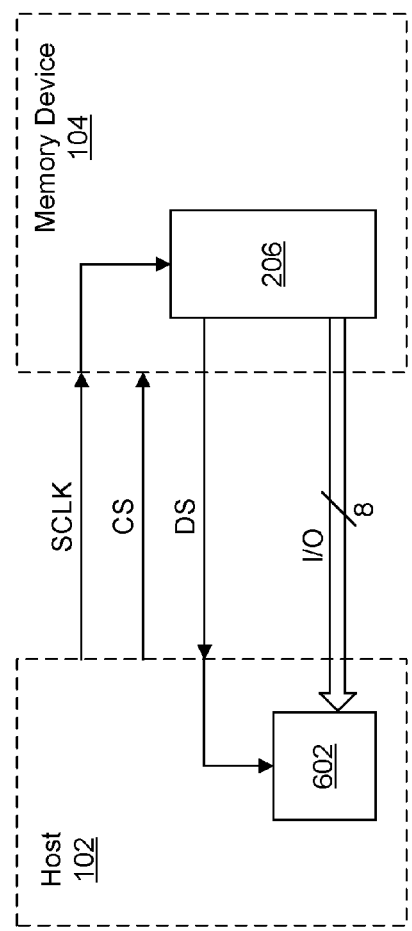
FIG. 6 is a block diagram of an example memory device and host arrangement with data strobe and I/O paths, in accordance with embodiments of the present invention.

Referring now to FIG. 6, shown is a block diagram 600 of an example memory device and host arrangement with data strobe and I/O paths, in accordance with embodiments of the present invention. This diagram shows an example timing propagation signal path including SCLK from host 102, which can be used to clock data into memory device 104. Output circuitry 206 can receive clock SCLK, and may generate (e.g., toggle) DS aligned with data transitions on the I/O lines. Host 102 can include receiver circuitry 602, which can utilize DS in order to clock in data via the I/O lines. Such source synchronous clocking can be utilized to address clock skew, and to maintain clock and data in phase. In addition, DS may be tri-stated by circuitry 206, such as to accommodate bus sharing among multiple memory devices, but a pull-down resistor at the system level may keep DS low when none of the memory devices are enabled.

In one embodiment, a memory device can include: (i) a memory array having a plurality of memory cells arranged as a plurality of data lines, where each data line includes a predetermined number of bytes of data, and where the memory array includes first and second array planes; (ii) an interface configured to receive a read command from a host that requests a plurality of bytes of data in a consecutively addressed order from an address of a starting byte; (iii) a first buffer configured to store a first of the plurality of data lines from the first array plane of the memory array, where the first data line includes the starting byte; (iv) a second buffer configured to store a second of the plurality of data lines from the second array plane of the memory array, where the second data line is consecutively addressed with respect to the first data line; (v) output circuitry configured to access data from the first buffer, and to sequentially output each byte from the starting byte through a highest addressed byte of the first data line; and (vi) the output circuitry being configured to access data from the second buffer, and to sequentially output each byte from a lowest addressed byte of the second data line until the predetermined number of bytes of data has been output in order to execute the read command.

Figure 7:
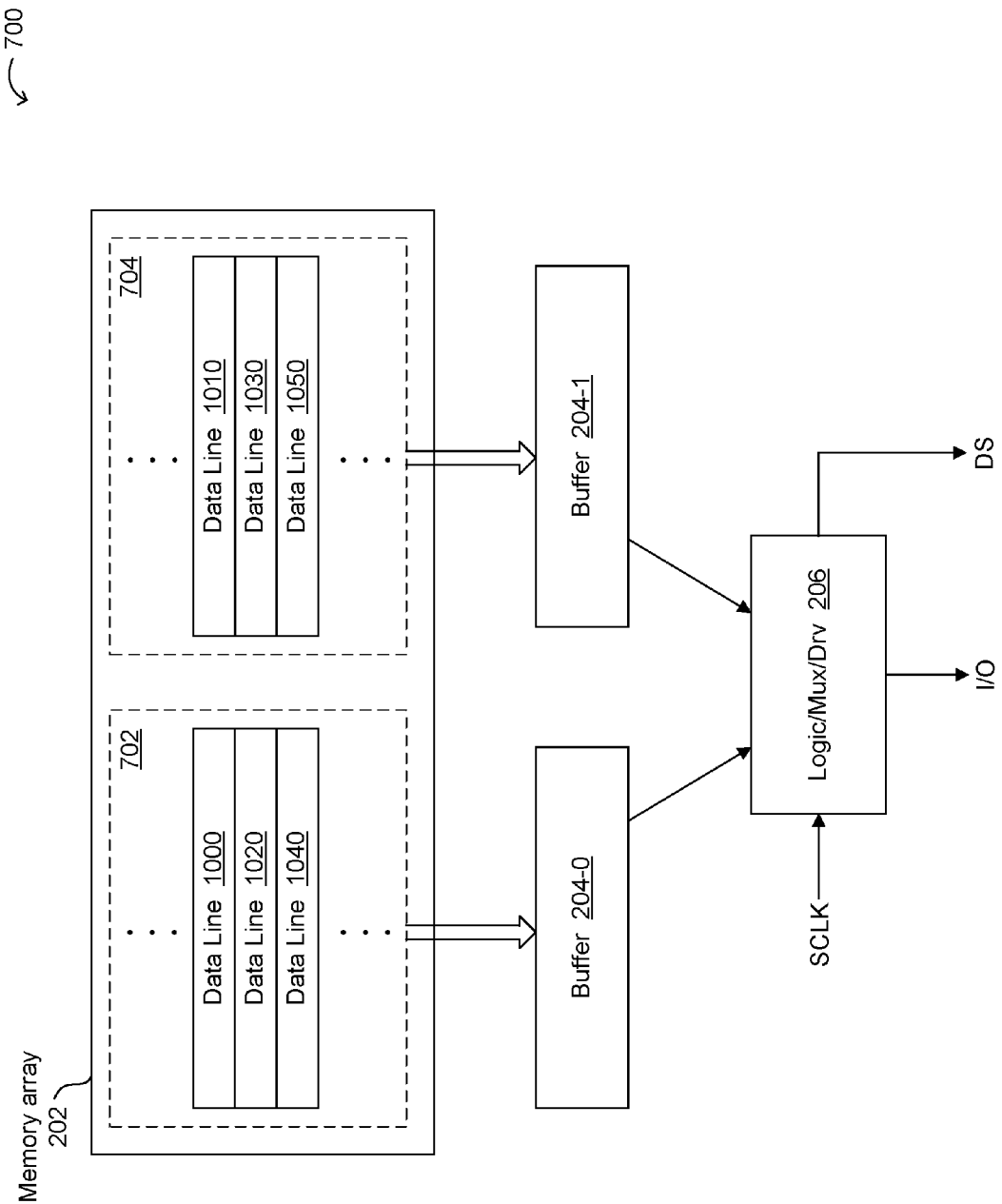
FIG. 7 is a block diagram of an example data line and buffer arrangement for interleaved data line access, in accordance with embodiments of the present invention.

Referring now to FIG. 7, shown is a block diagram 700 of an example data line and buffer arrangement for interleaved data line access, in accordance with embodiments of the present invention. In this case, memory array 202 can include separate array "planes," "banks," "portions," or "zones." For example, one such plane (e.g., 702) can include even number addressed data lines (e.g., 1000, 1020, 1040, etc.), and the other plane (e.g., 704) can include intervening/odd number addressed data lines (e.g., 1010, 1030, 1050, etc.). In this way, any two sequentially or consecutively addressed data lines can be found in separate array planes. Thus for example, data line 1000 can be found in array plane 702, while the next sequential data line 1010 can be found in array plane 704.

Thus in certain embodiments, the array can be organized as two separate (even and odd data line numbers) array planes. As discussed above, a data line can represent the number of bytes read by the memory array in single memory array access, and as may be determined by the number of shared sense amplifiers, or sense amplifiers that are activated during such a memory access. For example, 128 or 256 sense amplifiers may be utilized to provide a data throughput of 16 B (128 bits in 8 cycles), whereby a data line size is 16 bytes. With this configuration of even and odd data lines in separate array portions/planes, reading from both array planes simultaneously can be supported. However, in some cases, the accesses may be staggered in order to reduce noise, such as for initially filling a buffer based on the requested starting byte address.

In this way, the memory can be interleaved such that consecutive data lines reside in alternating arrays. For example, if the data line size is 128 bits, in a worst case scenario when a read access targets one of the four last bytes of the given data line, the device can perform two such reads in the same first cycle (see, e.g., FIG. 8C). If, however, the read target is to a byte address that is between 0 and B (hexadecimal), the second access could start one or more cycles later (see, e.g., FIGS. 8A and 8B). Further, in these cases, there may be no need to use DS for back pressure, as discussed above, because the number of dummy cycles may be fixed (but smaller).

In particular embodiments, read latency can be reduced by performing two memory array accesses substantially in parallel. Data read from memory array plane 702 can be provided to buffer 204-0, and data read from memory array plane 704 can be provided to buffer 204-1. Further, the interleaving can be based on the number of bits that are being read from the array in one array access cycle. For example, if 128 sense amplifiers are utilized in an array access, the memory array can be broken into two banks as shown such that even addressed 128 bit data lines reside in one bank, while the odd addressed 128 bit data lines reside in the other bank. For Octal DDR operation whereby the command addressed the one-before-last byte of the 128-bit data line, because the data may be needed from the next data line one cycle later than the data from the first line, the access to the second bank can begin a cycle after starting the access to the first bank.

In various cases, the access to the second bank can be delayed by from 1 to 8 cycles, depending on the start address. In other cases, the two array planes can be simultaneously accessed in a fully parallel fashion. Because data from the second bank (e.g., 704) may be needed to satisfy a read request in all cases except for the aligned case whereby the command addresses the first (e.g., least significant) byte in the data line, read latency can be substantially improved in this approach. For example, in uniform addressing, this second array plane access can reduce read latency in 7 out of 8 times. In addition, for reduced data line sizes (e.g., 64-bits) and other buffering applications, throughput can be maintained without additional sense amplifiers (e.g., maintaining at 128 sense amplifiers).

Figure 8A:
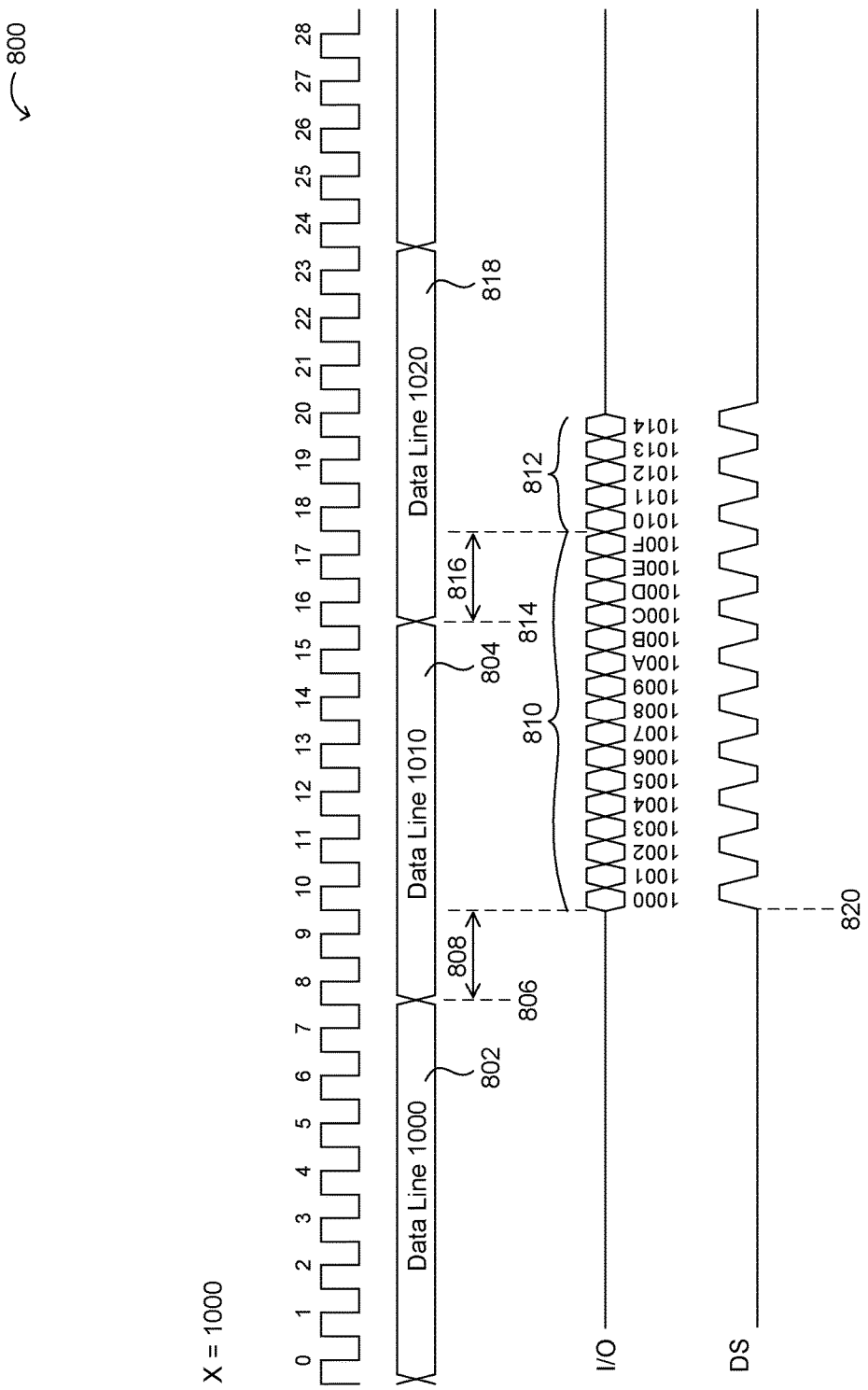
FIGS. 8A, 8B, and 8C are timing diagrams of example interleaved data line read accesses, in accordance with embodiments of the present invention.
Figure 8B:
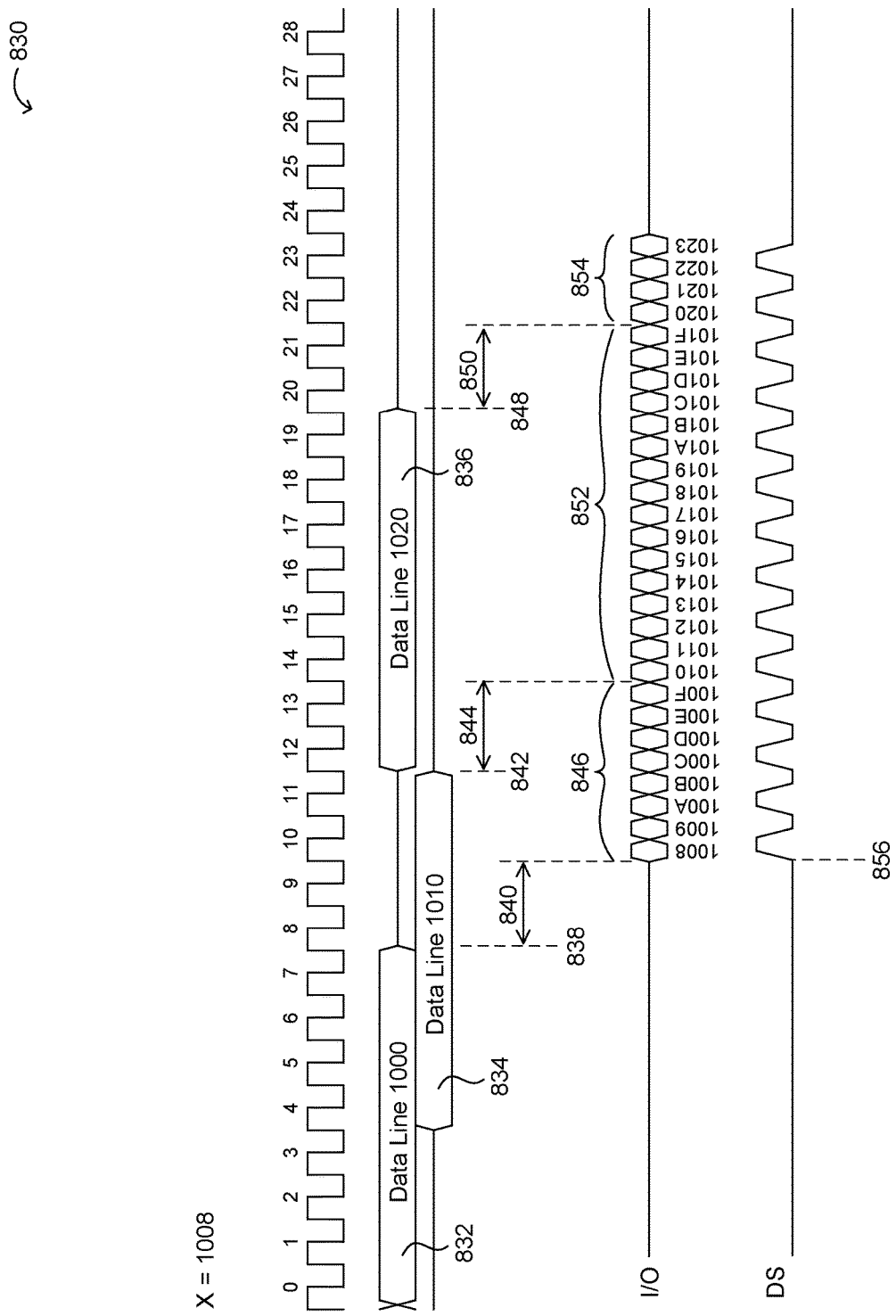
Figure 8C:
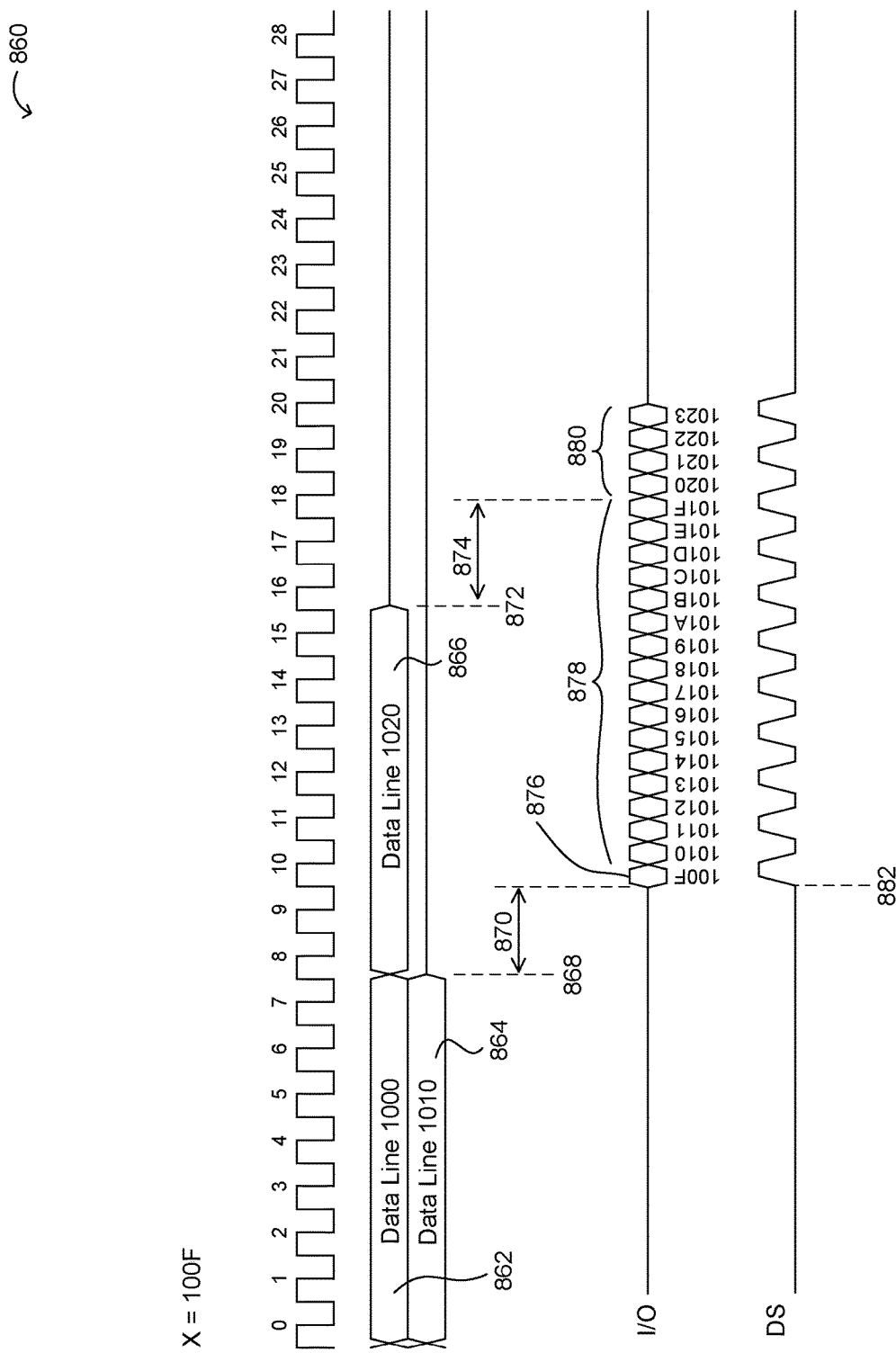

Referring now to FIGS. 8A, 8B, and 8C, shown are timing diagrams of example interleaved data line read accesses, in accordance with embodiments of the present invention. As shown in example 800 of FIG. 8A, a starting address "X" can be equal to 1000, and thus may be the lowest byte address of data line 1000. Accesses from memory array 202 are shown as access 802 of data line 1000 from left array plane 702, which can be provided to buffer 204-0, followed by access 804 of data line 1010 from right array plane 704, which can be provided to buffer 204-1, and then followed by access 818 of data line 1020 from left array plane 702, which can be provided to buffer 204-0. Thus, buffer 204-0 can be filled by 806, and delay 808 can represent access time from buffer 204-0 to the output via output circuitry 206. For example, data 810 that is output over 8 clock cycles at a double data rate can represent the full data of data line 1000, and data 812 may represent sequentially addressed bytes of data line 1010, in order to fill the read request. Thus in this example, 8 I/O lines may output a full data line of 16 bytes of data, and may be strobed out via DS beginning at 820. Also, buffer 204-1 can be filled by 814, and delay 816 may represent access time from buffer 204-1 to the output via output circuitry 206. Data 812 can represent partial data of sequentially/consecutively addressed data line 1010.

Example 830 of FIG. 8B shows a starting byte address of the given data line (e.g., 1000) that is not a lowest or highest byte address, but rather is somewhere in the middle (e.g., X=1008). In this example, access 832 may represent data from memory array 202 corresponding to the starting address (e.g., X=1008) contained within data line 1000, which may be read from left memory plane 702. Also, access 834 may represent data from the next sequentially addressed data line 1010, which may be accessed at least partially in parallel from right array plane 704, and access 836 may represent data from the consecutively/sequentially addressed data line 1020, which may be accessed from left array plane 702, as shown. It should be noted that the data strobe for clocking out the data may be activated at 856, which is the same time point as 820 in FIG. 8A.

Buffer 204-0 can be filled with data line 1000 by 838, and after delay 840 may be output as data 846. As shown, data 846 may represent consecutive data bytes starting at X=1008 through to the end or highest addressed byte (e.g., 100F) of data line 1000. By 842, bytes from data line 1010 may be available via buffer 204-1, and after delay 844 may be output as shown by data 852. By 848, data from data line 1020 may be available in buffer 204-0, and after delay 850 may be output as shown by data 854. As shown in this particular example, a staggered access between the initial memory array access of data line 1000 containing starting address X=1008 from array plane 702, and subsequent access of data line 1010 from array plane 704 can allow for reduced noise. However, in some cases these accesses may be performed in a fully parallel fashion, whereby access 834 can begin at a substantially same time as access 832.

Example 860 of FIG. 8C shows such a parallel access approach for the case of a starting byte address of the given data line (e.g., 1000) that is a highest byte address (e.g., X=100F) for that data line. In this example, access 862 may represent data from memory array 202 corresponding to the starting address (e.g., X=100F) contained within data line 1000, which may be read from left memory plane 702. Also, access 864 may represent data from the next sequentially addressed data line 1010, which may be accessed fully in parallel from right array plane 704, and access 866 may represent data from the consecutive and sequentially addressed data line 1020, which may be accessed from left array plane 702, as shown. Further, the data strobe for clocking out the data may be activated at 882, which is the same time point as 820 in FIG. 8A.

By 868, buffer 204-0 can be filled with data line 1000, and buffer 204-1 can be filled with data line 1010, and after delay 870 may be output as data 876 followed by data 878. As shown, data 876 represents the requested data byte at X=100F, and data 878 represents the lowest addressed byte 1010 through to the end or highest addressed byte (e.g., 101F) of data line 1010. By 872, bytes from data line 1020 may be available via buffer 204-0, and after delay 874 may be output as shown by data 880. Thus in this particular example, a fully parallel access can occur between the memory array access of data line 1000 containing starting address X=100F from array plane 702, and that of data line 1010 from array plane 704, followed by a subsequent access of data line 1020.

In one embodiment, a memory device can include: (i) a memory array having a plurality of memory cells arranged as a plurality of data lines, where each data line includes a predetermined number of bytes of data, and where the memory array includes first and second word lines; (ii) an interface configured to receive a read command from a host that requests a plurality of bytes of data in a consecutively addressed order from an address of a starting byte; (iii) a first buffer configured to store a first of the plurality of data lines from along the first word line of the memory array, where the first data line includes the starting byte; (iv) a second buffer configured to store a second of the plurality of data lines from along the first word line of the memory array, where the second data line is consecutively addressed with respect to the first data line, and where the second data line is duplicated along the second word line of the memory array; (v) output circuitry configured to access data from the first buffer, and to sequentially output each byte from the starting byte through a highest addressed byte of the first data line; and (vi) the output circuitry being configured to access data from the second buffer, and to sequentially output each byte from a lowest addressed byte of the second data line until the predetermined number of bytes of data has been output in order to execute the read command.

Figure 9:
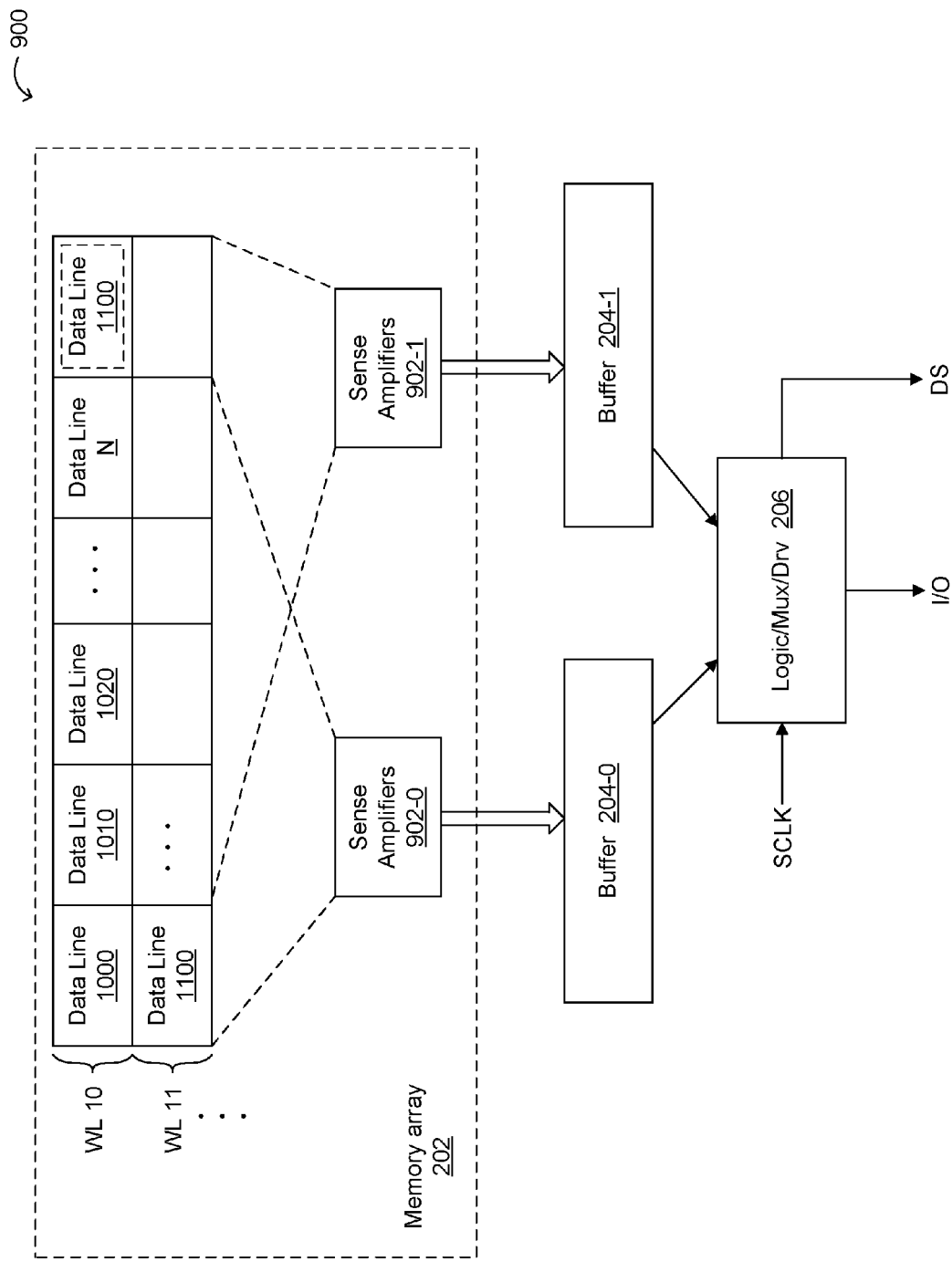
FIG. 9 is a block diagram of an example memory array and buffer arrangement with duplicate data lines for adjacent word lines, in accordance with embodiments of the present invention.

Referring now to FIG. 9, shown is a block diagram 900 of an example memory array and buffer arrangement with duplicate data lines for adjacent word lines, in accordance with embodiments of the present invention. In this particular example, memory array 202 can be organized such that data is replicated at the end of one word line to match data at the beginning of a next word line. For example, data lines sharing a common WL 10 can include data line 1000, data line 1010, data line 1020, . . . data line N, and data line 1100, where a next subsequent or consecutive data line 1100 also shares this same data at a beginning of that next word line (e.g., WL 11). This replicated data, as shown in the dashed box for data line 1100 at the end of WL 10 can be configured such that only a single word line access may be needed in order to satisfy a read request, regardless of the starting address of that read request.

In addition, sense amplifiers 902-0 and 902-1 can map to the data lines along the word lines such that one such amplifier bank, or both amplifier banks 902, may be activated in order to satisfy a given read request. Thus for example, a given word line can be activated to access data, and an amount of data coincident with a data line size (e.g., 128 b) can be accessed out of those bytes that are found along a common word line (e.g., 1 Kb of data along the word line, versus 128 b of data in the data line). The associated sense amplifiers 902 can also be activated in order to read the data, and to provide to the corresponding buffer 204. In this way, data from a starting point (starting address) to a data line size (e.g., 128 b) forward (consecutively addressed) can be accessed in one memory array access cycle such that a full amount of data (e.g., 128 b) needed in order to fill the associated buffer and fulfill the read request can be accommodated. Further, the timing of such an access may be consistent with one that would begin or have a starting byte address that is aligned with the beginning of the data line.

Thus in particular embodiments, the word line extension can be equivalent to a data line size (e.g., 128 b), and the extension may store a duplicate of the first data line (e.g., 1100) of the next adjacent word line (e.g., WL 11). As such, while the size of memory array 202 has increased in this approach, a large read latency reduction may be realized. However, one drawback of this approach is that two write cycles may be needed in order to replicate the appropriate data line (e.g., 1100). In this approach, reads can occur on data line boundaries (e.g., of 128 b), so may read first and second 128 b chunks of data in the same array access cycle (256 b total). Also, the write impact may be undefined as to time because the memory device can turn to a busy state, then indicate when the write operation has completed, and in-line execution may mostly be read operations.

In this approach, data that "belongs" to two "rows" can be read instead of one, and may activate, e.g., 256 sense amplifiers instead of 128 sense amplifiers. By adding a duplicate row or data line (e.g., the same as row 0 of WL+1) at end of the array, reading two data lines from the same WL can be enabled. In this way, the memory array may only need be read once in order to satisfy a read request, which can save about 50% of read latency in some cases. In an alternative approach, a single bank of sense amplifiers 902 (e.g., 128 sense amplifiers) can be retained, and two read cycles can be performed, such as in cases whereby reading two such rows from the same WL may not save a substantial amount of time, as compared to reading one row from WLn and one row from WLn+1.

Figure 10:
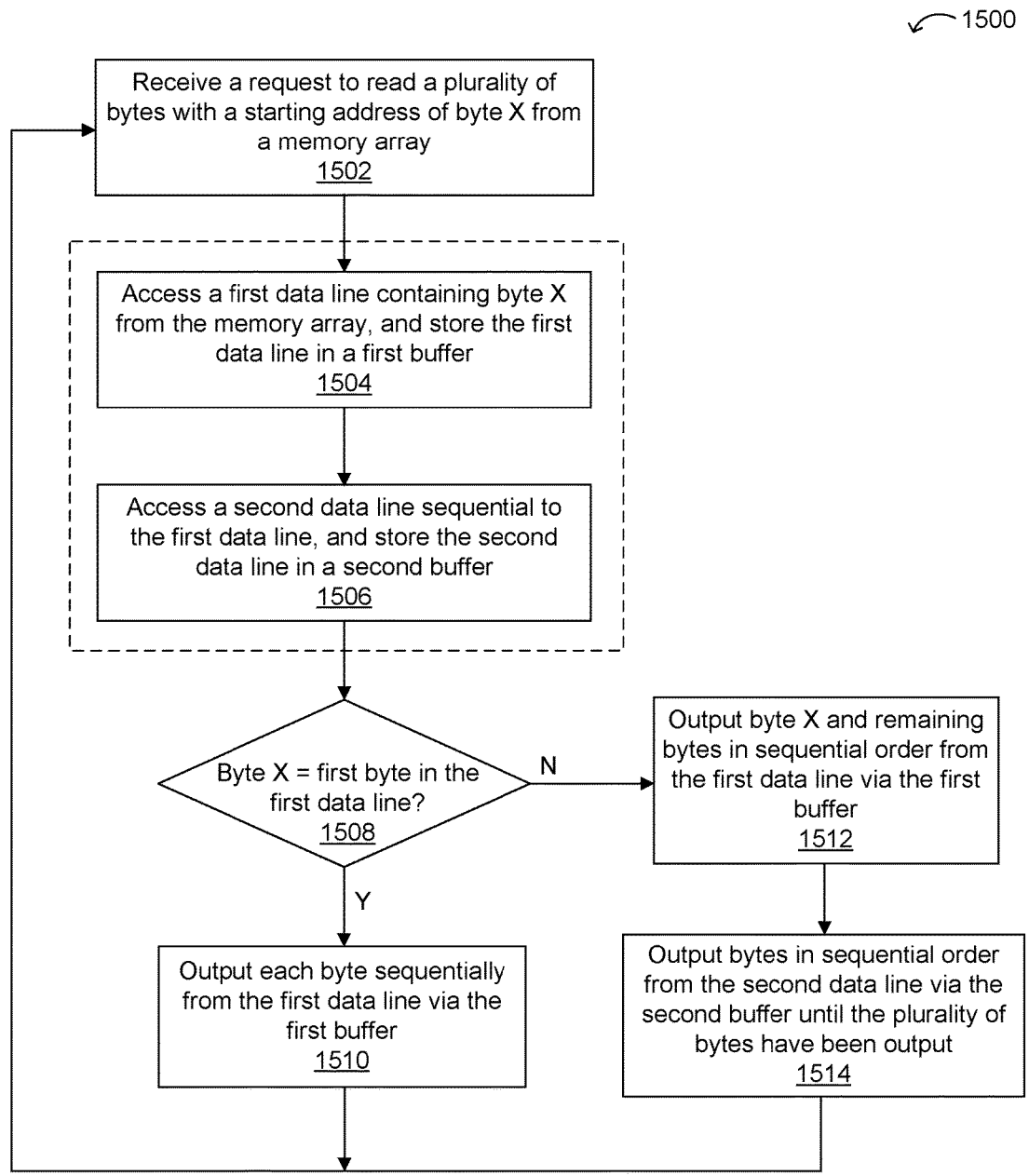
FIG. 10 is a flow diagram of an example method of reading bytes of data from a memory array, in accordance with embodiments of the present invention.

Referring now to FIG. 10, shown is a flow diagram 1500 of an example method of reading bytes of data from a memory array, in accordance with embodiments of the present invention. At 1502, a read request can be received to read a plurality of bytes (e.g., equal to a data line size) with a starting address of byte X from a memory array (e.g., 202). As discussed above, the memory array may be organized to accommodate interleaved accesses (see, e.g., FIG. 7), with extended/replicated data (see, e.g., FIG. 9), or to allow for ping-ponged accesses (see, e.g., FIG. 2). Thus in particular embodiments, a variety of memory array and data line configurations may be supported in order to reduce read latency therefrom.

In any event, at 1504, a first data line containing byte X can be accessed from the memory array, and may be stored in a buffer (e.g., 204-0). At 1506, a second data line that is sequential (e.g., adjacent, consecutively addressed) to the first data line, can be accessed and stored in another buffer (e.g., 204-1). Also, as discussed above with reference to FIG. 7, accesses 1504 and 1506 can be done partially or fully in parallel. If at 1508, byte X is the first byte or the lowest addressed byte of the first data line, only the first data buffer (e.g., 204-0) need be utilized in order to satisfy the read request. In this case, at 1510, each byte can sequentially be output from this first data line via the first buffer, in order to satisfy the read request. One example of such a case is shown in FIG. 5. As also shown, the data strobe can be triggered consistent with data being output from the memory device, in order to notify the host that the requested data is ready, and to provide a clock with timing sufficient to receive/clock this data in the host.

If at 1508, byte X is not the first lowest addressed byte of the first data line, then the data required to fulfill the read request may be pulled from across a data line boundary, and thus two data lines need be accessed from memory array 202. In this case, at 1512, byte X and remaining bytes in sequential order can be output from the first data line via the first buffer (see, e.g., 846 of FIG. 8B). At 1514, bytes can be output sequential order from the second data line via the second buffer (e.g., 204-1) until the plurality of bytes (e.g., a data line size) have been output from the memory device in order to satisfy the read request (see, e.g., 852 of FIG. 8B). In this way, various memory array configurations can be supported in order to reduce read latencies by way of such configurations, as well as by toggling the data strobe as soon as data is ready for appropriate cases (see, e.g., FIG. 5).

Particular embodiments may also support options to operate on other byte boundaries (e.g., 2, 4, 8, etc.), which can allow for interface performance increases in some cases. Also, in order to accommodate higher interface frequencies, particular embodiments may support differential input (e.g., SCK) and output (e.g., DS) clocks, such as with an external reference voltage. Additionally, or alternatively, a synchronous data transfer can involve options as to specifying a number of dummy cycles, which may define the earliest time the data may be returned to the host. However, if the controller (e.g., host 102) is able to handle the data immediately, this value may remain at the minimum setting, and the memory device may output data as fast as it can.

When receiving data, the host controller may count incoming DS pulses, continue clocking until it has received as many DS clocks as desired, and may no longer rely on counting the SCK clocks generated by the host. For example, a minimum number of wait states can be set in a register, such as a mode byte for specifying minimum dummy cycles. The host can also stop the outgoing SCK for a number of cycles in order to give itself time to prepare for the arriving data. In one case, the minimum number of dummy cycles may be 0, if operating at a relatively low frequency. In a variable setting, the read commands may have 0 wait states up to a certain frequency, and one or more dummy cycles after that, in some cases.

While the above examples include circuit, operational, and structural implementations of certain memory arrangements and devices, one skilled in the art will recognize that other technologies and/or architectures can be used in accordance with embodiments. Further, one skilled in the art will recognize that other device circuit arrangements, architectures, elements, and the like, may also be used in accordance with embodiments. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device, comprising:
a) a memory array comprising a plurality of memory cells arranged as a plurality of data lines, wherein each data line comprises a predetermined number of bytes of data;
b) an interface configured to receive a read command from a host that requests a plurality of bytes of data in a consecutively addressed order from an address of a starting byte;
c) a first buffer configured to store a first of the plurality of data lines from the memory array, wherein the first data line comprises the starting byte;
d) a second buffer configured to store a second of the plurality of data lines from the memory array, wherein the second data line is consecutively addressed with respect to the first data line;
e) output circuitry configured to access data from the first buffer, and to sequentially output each byte from the starting byte through a highest addressed byte of the first data line;
f) the output circuitry being configured to access data from the second buffer, and to sequentially output each byte from a lowest addressed byte of the second data line until the requested plurality of bytes of data has been output in order to execute the read command; and
g) a data strobe driver configured to clock each byte of data output from the memory device by a data strobe on the interface, wherein the data strobe is activated at a reduced read latency in response to the first buffer receiving the first data line, and wherein the second buffer receives the second data line prior to the data output from the first buffer being completed.

2. The memory device of claim 1, wherein the predetermined number of bytes of data in each data line is 16 bytes.

3. The memory device of claim 1, further comprising a plurality of sense amplifiers activated to read the predetermined number of bytes of data.

4. The memory device of claim 1, wherein:
a) the memory array comprises non-volatile memory; and
b) the interface comprises a serial interface.

5. The memory device of claim 1, wherein the interface is configured to output a byte of data for each transition of the data strobe.

6. The memory device of claim 1, wherein the rate of transferring data from the memory array to the first and second buffers is equal or larger than the maximum rate of transferring data from the first and second buffers to the host, and wherein the time to fill the second buffer with new data from the memory array is equal or smaller than the time required to send the remaining bytes in the first buffer to the host.

7. A memory device, comprising:
a) a memory array comprising a plurality of memory cells arranged as a plurality of data lines, wherein each data line comprises a predetermined number of bytes of data, and wherein the memory array comprises first and second array planes;
b) an interface configured to receive a read command from a host that requests a plurality of bytes of data in a consecutively addressed order from an address of a starting byte;
c) a first buffer configured to store a first of the plurality of data lines read from the first array plane of the memory array, wherein the first data line comprises the starting byte;
d) a second buffer configured to store a second of the plurality of data lines read from the second array plane of the memory array, wherein the second data line is consecutively addressed with respect to the first data line;
e) output circuitry configured to access data from the first buffer, and to sequentially output each byte from the starting byte through a highest addressed byte of the first data line, wherein the output circuitry is configured to output data in response to the first buffer receiving the first data line from the memory array; and
f) the output circuitry being configured to access data from the second buffer, and to sequentially output each byte from a lowest addressed byte of the second data line until the predetermined number of bytes of data has been output in order to execute the read command, wherein the second buffer receives the second data line prior to the data output from the first buffer being completed.

8. The memory device of claim 7, wherein the predetermined number of bytes of data in each data line is 16 bytes.

9. The memory device of claim 7, further comprising a plurality of sense amplifiers activated to read the predetermined number of bytes of data from the memory array.

10. The memory device of claim 7, wherein the rate of transferring data from the memory array to the first and second buffers is equal or larger than the maximum rate of transferring data from the first and second buffers to the host, and wherein the time to fill the second buffer with new data from the memory array is equal or smaller than the time required to send the remaining bytes in the first buffer to the host.

11. The memory device of claim 7, wherein the first and second data lines are accessed fully in parallel from the first and second array planes.

12. The memory device of claim 7, wherein the first and second data lines are accessed at least partially in parallel from the first and second array planes.

13. The memory device of claim 7, wherein the first and second data lines are accessed sequentially from the first and second array planes.

14. A memory device, comprising:
   a) a memory array comprising a plurality of memory cells arranged as a plurality of data lines, wherein each data line comprises a predetermined number of bytes of data, and wherein the memory array comprises first and second word lines;
   b) an interface configured to receive a read command from a host that requests a plurality of bytes of data in a consecutively addressed order from an address of a starting byte;
   c) a first buffer configured to store a first of the plurality of data lines from along the first word line of the memory array, wherein the first data line comprises the starting byte;
   d) a second buffer configured to store a second of the plurality of data lines from along the first word line of the memory array, wherein the second data line is consecutively addressed with respect to the first data line, and wherein the second data line is duplicated along the second word line of the memory array;
   e) output circuitry configured to access data from the first buffer, and to sequentially output each byte from the starting byte through a highest addressed byte of the first data line; and
   f) the output circuitry being configured to access data from the second buffer, and to sequentially output each byte from a lowest addressed byte of the second data line until the predetermined number of bytes of data has been output in order to execute the read command.

15. The memory device of claim 14, wherein the predetermined number of bytes of data in each data line is 16 bytes.

16. The memory device of claim 14, wherein:
   a) the memory array comprises non-volatile memory; and
   b) the interface comprises a serial interface.

17. The memory device of claim 14, further comprising a plurality of sense amplifiers activated to read the first data line.

18. The memory device of claim 14, further comprising a plurality of sense amplifiers activated to read the second data line.

19. The memory device of claim 14, wherein the duplicated second data line is the lowest addressed data line along the second word line of the memory array.

20. The memory device of claim 14, wherein the duplicated second data line is the highest addressed data line along the first word line of the memory array.

\* \* \* \* \*